(12) United States Patent
Brouwer et al.

(10) Patent No.: US 11,347,152 B2
(45) Date of Patent: May 31, 2022

(54) SCAN SIGNAL CHARACTERIZATION DIAGNOSTICS

(71) Applicants: ASML Netherlands B.V., Veldhoven (NL); ASML Holding N.V., Veldhoven (NL)

(72) Inventors: Cornelis Melchior Brouwer, Veldhoven (NL); Krishanu Shome, Cheshire, CT (US)

(73) Assignees: ASML Netherlands B.V., Veldhoven (NL); ASML Holding N.V., Veldhoven (NL)

( * ) Notice: Subject to any disclaimer, the term of this patent is extended or adjusted under 35 U.S.C. 154(b) by 0 days.

(21) Appl. No.: 16/961,081

(22) PCT Filed: Dec. 19, 2018

(86) PCT No.: PCT/EP2018/085918
§ 371 (c)(1),
(2) Date: Jul. 9, 2020

(87) PCT Pub. No.: WO2019/141481
PCT Pub. Date: Jul. 25, 2019

(65) Prior Publication Data
US 2020/0401053 A1    Dec. 24, 2020

Related U.S. Application Data

(60) Provisional application No. 62/618,230, filed on Jan. 17, 2018.

(51) Int. Cl.
*G03F 7/20* (2006.01)
*G03F 9/00* (2006.01)

(52) U.S. Cl.
CPC ........ *G03F 7/70633* (2013.01); *G03F 9/7065* (2013.01); *G03F 9/7076* (2013.01); *G03F 9/7088* (2013.01); *G03F 9/7092* (2013.01)

(58) Field of Classification Search
CPC .. G03F 7/70633; G03F 9/7065; G03F 9/7076; G03F 9/7088; G03F 9/7092; G03F 7/70616; G03F 7/705; G03F 7/70625
See application file for complete search history.

(56) References Cited

U.S. PATENT DOCUMENTS

| | | |
|---|---|---|
| 6,297,876 B1 | 10/2001 | Bornebroek |
| 6,961,116 B2 | 11/2005 | Den Boef et al. |
| 7,354,684 B2 | 4/2008 | Dersch et al. |

(Continued)

FOREIGN PATENT DOCUMENTS

| | | |
|---|---|---|
| CN | 106062634 A | 10/2016 |
| CN | 107728121 A | 2/2018 |
| EP | 1434103 A2 | 6/2004 |
| EP | 1628164 A2 | 2/2006 |
| JP | H06-244085 A | 9/1994 |

(Continued)

OTHER PUBLICATIONS

International Search Report and Written Opinion of the International Searching Authority, directed to related International Patent Application No. PCT/EP2018/085918, dated Apr. 17, 2019; 9 pages.

(Continued)

*Primary Examiner* — Mesfin T Asfaw
(74) *Attorney, Agent, or Firm* — Sterne, Kessler, Goldstein & Fox P.L.L.C.

(57) ABSTRACT

A system for and method of processing a wafer in which a scan signal is analyzed locally to extract information about alignment, overlay, mark quality, wafer quality, and the like.

21 Claims, 8 Drawing Sheets

(56) References Cited

U.S. PATENT DOCUMENTS

| | | |
|---|---|---|
| 9,804,504 B2 | 10/2017 | Chen et al. |
| 9,939,742 B2 | 4/2018 | Tinnemans et al. |
| 10,073,357 B2 | 9/2018 | Van Der Schaar et al. |
| 2004/0179184 A1 | 9/2004 | Levasier et al. |
| 2005/0025352 A1 | 2/2005 | Suzuki et al. |
| 2006/0061743 A1 | 3/2006 | Den Boef et al. |
| 2009/0176167 A1 | 7/2009 | Hulsebos et al. |
| 2010/0214550 A1* | 8/2010 | Hulsebos .............. G03F 9/7049 355/74 |
| 2011/0153660 A1 | 6/2011 | Chu et al. |
| 2015/0227061 A1 | 8/2015 | Tinnemans et al. |
| 2019/0064680 A1 | 2/2019 | Schmitt-weaver et al. |

FOREIGN PATENT DOCUMENTS

| | | |
|---|---|---|
| JP | 2005-530145 A | 10/2005 |
| JP | 2007-298954 A | 11/2007 |
| JP | 2016-502134 A | 1/2016 |
| TW | 201531811 A | 8/2015 |
| TW | 1630465 B | 7/2018 |
| WO | WO 2017/153069 A1 | 9/2017 |
| WO | WO 2018/033499 A1 | 2/2018 |

OTHER PUBLICATIONS

International Preliminary Report on Patentability directed to International Patent Application No. PCT/EP2018/085918, dated Jul. 21, 2020; 6 pages.

Menchtchikov et al., "Computational scanner wafer mark alignment", Proceedings of SPIE, vol. 10147, Mar. 30, 2017; 10 pages.

* cited by examiner

SCAN SIGNAL CHARACTERIZATION DIAGNOSTICS

CROSS-REFERENCE TO RELATED APPLICATIONS

This application claims priority of U.S. Provisional Patent Application No. 62/618,230, which was filed on Jan. 17, 2018, and which is incorporated herein in its entirety by reference.

FIELD

The present disclosure relates to the manufacture of devices using lithographic techniques. Specifically, the present disclosure relates to analysis of scan signals to characterize and control semiconductor photolithographic processes.

BACKGROUND

A lithographic apparatus can be used, for example, in the manufacture of integrated circuits (ICs). For that application, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

In order to monitor the lithographic process, it is necessary to measure parameters of the patterned substrate, for example the overlay error between successive layers formed in or on it. Devices are built up layer by layer and overlay is a measure of the ability of the lithographic apparatus to print these layers accurately on top of each other. Successive layers or multiple processes on the same layer must be accurately aligned to the previous layer, otherwise electrical contact between structures will be poor and the resulting devices will not perform to specification. Overlay is a measure of the accuracy of this alignment. Good overlay improves device yield and enables smaller product patterns to be printed. The overlay error between successive layers formed in or on the patterned substrate is controlled by various parts of the exposure apparatus (of the lithographic apparatus). It is mostly the alignment system of the lithographic apparatus that is responsible for the alignment of the radiation onto the correct portions of the substrate.

There are various techniques for making measurements of the microscopic structures formed in lithographic processes, including the use of scanning electron microscopes and various specialized tools. One form of specialized inspection tool is a scatterometer in which a beam of radiation is directed onto a target on the surface of the substrate and properties of the scattered or reflected beam are measured. By comparing the properties of the beam before and after it has been reflected or scattered by the substrate, various properties of the substrate can be determined. This can be done, for example, by comparing the reflected beam with data stored in a library of known measurements associated with known substrate properties. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle. Included in this latter category are interferometric approaches that use phase information of diffracted orders of the radiation beam.

The scanning of the alignment marks results in a raw scan signal. Various values such as aligned position per color, order, and polarization may be derived from this signal. Other examples of values derived from the scan signal include Col2Col position (difference in position between multiple colors used in the sensor) Wafer Quality (the normalized diffraction light power, WQ) and Multiple Correlation Coefficient (MCC). The scanning signal is processed using FFT fitting on the original time domain data to obtain information about the signal's frequency characteristics. These techniques, however, cannot be used by themselves to properly detect various alignment issues such as damage to the alignment marks (e.g., Parallel Integrated Lens Interferometer At Scanner (PARIS) mark damage, local deformations within the mark, stack properties). In addition alignment mark deformation can cause the aligned position to shift as background content will contain frequency content of the alignment mark which will have crosstalk into an FFT fit algorithm.

Customer processing of wafers also causes variations across the mark which affect the aligned position. For example, a varying background signal across the mark scan length affects alignment position, or varying deformation across the mark can change mark asymmetry which can lead to alignment position error.

There is thus a need to be able to provide a an alignment system that can properly detect more alignment errors and can accommodate variations caused by customer modifications.

SUMMARY

The following presents a simplified summary of one or more embodiments in order to provide a basic understanding of the embodiments. This summary is not an extensive overview of all contemplated embodiments, and is not intended to identify key or critical elements of all embodiments nor delineate the scope of any or all embodiments. Its sole purpose is to present some concepts of one or more embodiments in a simplified form as a prelude to the more detailed description that is presented later.

By characterizing and dissecting (breaking down) the scan signal using local curve fitting techniques, additional diagnostic parameters can be extracted from the scan signal, in particular, information about localized physical properties. This makes calculated values available for control of the scanner and of user processes thus providing users with an enhanced ability to tune their processes, as well as parameters which will allow the scanner to better diagnose alignment issues such as mark damage and even assess overall wafer quality. It also helps in removing the effect of background signals and hence improves determination of alignment position and overlay accuracy of patterns making up a layer or layers. The breakdown parameters may also be used to correct for local mark deformation in the signal reducing crosstalk from background content on the aligned position. These capabilities are created or enhanced by additional processing of the scan signal, either offline or inline in firmware or by software during the signal acquisition itself.

According to one aspect, local information is used to monitor and improve wafer processing.

According to another aspect there is disclosed an apparatus for controlling processing of a wafer in a lithographic apparatus, the apparatus comprising a light source for illuminating at least a portion of the wafer, a sensor for sensing light from the portion when the portion is being illuminated by the light source and for generating a scan signal indicative of the sensed light, and a processor arranged to receive the scan signal and adapted to generate a plurality of local fit coefficients respectively for each of a plurality of samples of the scan signal and to generate a control signal based at least in part on the plurality of local fit coefficients, and a controller arranged to receive the control signal for controlling at least one aspect of processing the wafer based at least in part on the control signal. The aspect may be overlay alignment and the portion may comprise at least one alignment mark. The aspect may be chemical mechanical polishing and the portion may comprises at least one mark sensitive to variation in chemical mechanical polishing. The sensor may have an objective and the processor may be adapted to use at least a subset of the plurality of local fit coefficients to determine a distance between the objective and a reflecting layer on the wafer, and the controller may generate the control signal based at least in part on the distance to control exposure focus at least in part on the control signal. The plurality of local fit coefficients may comprise a plurality of local DC offset coefficients, a plurality of local amplitude coefficients, or some combination of a plurality of local DC offset coefficients and a plurality of local amplitude coefficients. The plurality of local amplitude coefficients may be calculated using a fast Fourier transform. The plurality of local fit coefficients may comprise a plurality of local phase coefficients. The plurality of local phase coefficients may be calculated using a Hilbert transform. The plurality of local fit coefficients may be smoothed.

According to another aspect there is disclosed a system for aligning a wafer in a lithographic apparatus, the wafer including at least one alignment mark, the system comprising a light source for illuminating the mark, a sensor for sensing light from the mark when the mark is being illuminated by the light source and for generating an alignment scan signal indicative of the light from the mark, and a processor arranged to receive the signal and adapted to generate a respective at least one local fit coefficient for each of a plurality of samples of the signal, wherein the lithographic apparatus is adapted to use the at least one local fit coefficient to adjust alignment of the wafer. The mark may be transmissive. The mark may be reflective. The at least one fit coefficient may be a local FFT fit coefficient. The at least one fit coefficient may be smoothed. The at least one fit coefficient may be a local DC offset fit coefficient. The at least one fit coefficient may be a local Hilbert transform fit coefficient. The processor may be adapted to generate a respective at least one local fit coefficient for each of a plurality of samples of the signal to generate a plurality of local fit coefficients and to subtract the plurality of fit coefficients from the alignment signal to generate a residual signal and the lithographic apparatus may be adapted to use the residual signal to adjust alignment of the wafer. The processor may be adapted to use the at least one local fit coefficient to determine a deformation of the mark. The processor may be adapted to use the at least one local fit coefficient to determine high spatial frequency grid content by evaluating a local phase per subsegment of the signal from a single scan of the mark.

According to another aspect there is disclosed a system for aligning a wafer in a lithographic apparatus, the wafer including at least one alignment mark, the system comprising a light source for illuminating the mark, a sensor for sensing light from the mark when the mark is being illuminated by the light source and for generating an alignment scan signal indicative of the light from the mark, and a processor arranged to receive the signal and adapted to generate a respective local FFT fit coefficient for each of a plurality of samples of the signal to generate a corresponding plurality of local FFT fit coefficients for the plurality of samples and to generate a respective local DC fit coefficient for each of a plurality of samples of the signal to generate a corresponding plurality of local DC fit coefficients for the plurality of samples and for each sample subtract a respective one of the plurality of local FFT fit coefficients and a respective one of the plurality of DC fit coefficients from the alignment signal for the sample to obtain a residual signal for the plurality of samples, wherein the lithographic apparatus may be adapted to use the residual signal to adjust alignment of the wafer.

According to another aspect there is disclosed a method of processing a wafer in a lithographic apparatus comprising the steps of illuminating a portion of the wafer using a light source, sensing light from the portion when the portion is being illuminated by the light source, generating a scan signal indicative of the sensed light, generating a plurality of local fit coefficients respectively for each of a plurality of samples of the scan signal, generating a control signal based at least in part on the plurality of local fit coefficients, and controlling at least one aspect of processing the wafer based at least in part on the control signal. The at least one aspect may be overlay alignment and the portion may comprise at least one alignment mark. The at least one aspect may be chemical mechanical polishing and the portion may comprise at least one mark sensitive to variation in chemical mechanical polishing. The sensor may have an objective and the processor may be adapted to use at least a subset of the plurality of local fit coefficients to determine a distance between the objective and a reflecting layer on the wafer, and wherein the controller generates the control signal based at least in part on the distance to control exposure focus at least in part on the control signal. The plurality of local fit coefficients may comprise a plurality of local DC offset coefficients. The plurality of local fit coefficients may comprise a plurality of local amplitude coefficients. The plurality of local amplitude coefficients may be calculated using a fast Fourier transform. The plurality of local fit coefficients may comprise a plurality of local phase coefficients. The plurality of local phase coefficients may be calculated using a Hilbert transform.

According to another aspect there is disclosed a method of aligning a wafer in a lithographic apparatus, the wafer including at least one alignment mark, the method comprising the steps of illuminating the alignment mark using a light source, sensing light from the mark when the mark is being illuminated by the light source, generating an alignment scan signal indicative of the light from the mark, generating a respective at least one local fit coefficient for each of a plurality of samples of the signal based on the signal, and using the at least one local fit coefficient to adjust alignment of the wafer. The mark may be transmissive. The mark may be reflective. The at least one fit coefficient may be a local FFT fit coefficient. The at least one fit coefficient may be a smoothed local FFT fit coefficient. The at least one fit coefficient may be a local DC offset fit coefficient. The at least one fit coefficient may be a local Hilbert transform fit coefficient. The generating step may further comprise generating a respective at least one local fit coefficient for each of a plurality of samples of the signal to generate a plurality of local fit coefficients and subtracting the plurality of fit coefficients from the alignment signal to generate a residual signal and wherein the using step comprises using the residual signal to adjust alignment of the wafer. The using step may comprise using the at least one local fit coefficient to determine a deformation of the mark. The using step may comprise using the at least one local fit coefficient to determine high spatial frequency grid content by evaluating a local phase per sub segment of the signal from a single scan of the mark.

According to another aspect there is disclosed a method of aligning a wafer in a lithographic apparatus, the wafer including at least one alignment mark, the method comprising the steps of illuminating the mark, sensing light from the mark when the mark is being illuminated, generating an alignment scan signal indicative of the light from the mark, generating from the alignment scan signal a respective local FFT fit coefficient for each of a plurality of samples of the signal to generate a corresponding plurality of local FFT fit coefficients for the plurality of samples and to generate a respective local DC fit coefficient for each of a plurality of samples of the signal to generate a corresponding plurality of local DC fit coefficients for the plurality of samples, for each sample, subtracting a respective one of the plurality of local FFT fit coefficients and a respective one of the plurality of DC fit coefficients from the alignment signal for the sample to obtain a residual signal for the plurality of samples, and using the residual signal to adjust alignment of the wafer.

Further embodiments, features, and advantages of the present invention, as well as the structure and operation of the various embodiments are described in detail below with reference to accompanying drawings.

BRIEF DESCRIPTION OF THE DRAWING

The accompanying drawings, which are incorporated herein and form part of the specification, illustrate the methods and systems of embodiments of the invention by way of example, and not by way of limitation. Together with the detailed description, the drawings further serve to explain the principles of and to enable a person skilled in the relevant art(s) to make and use the methods and systems presented herein. In the drawings, like reference numbers indicate identical or functionally similar elements.

Figure 1:
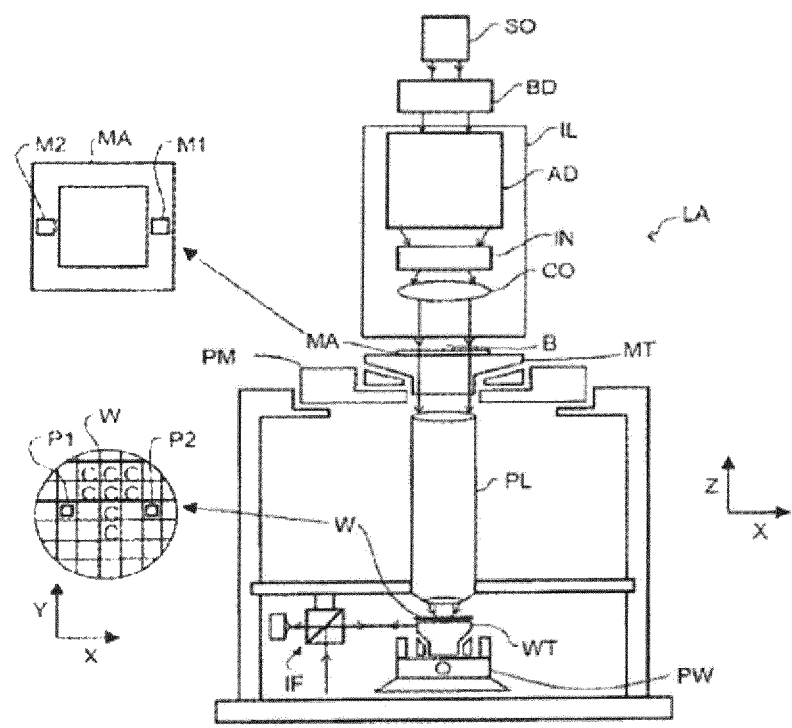
FIG. 1 is a schematic diagram of a photolithography system such as could be used to according to aspects of an embodiment disclosed herein.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art based on the teachings contained herein.

DETAILED DESCRIPTION

Various embodiments are now described with reference to the drawings, wherein like reference numerals are used to refer to like elements throughout. In the following description, for purposes of explanation, numerous specific details are set forth in order to promote a thorough understanding of one or more embodiments. It may be evident in some or all instances, however, that any embodiment described below can be practiced without adopting the specific design details described below. In other instances, well-known structures and devices are shown in block diagram form in order to facilitate description of one or more embodiments. The following presents a simplified summary of one or more embodiments in order to provide a basic understanding of the embodiments. This summary is not an extensive overview of all contemplated embodiments, and is not intended to identify key or critical elements of all embodiments nor delineate the scope of any or all embodiments.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include solid state memory, read only memory (ROM), random access memory (RAM), magnetic disk storage media, optical storage media, flash memory devices; electrical, optical, acoustical or other forms of propagated signals (e.g., carrier waves, infrared signals, digital signals, etc.), and others. Further, firmware, software, routines, and instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented. In the description that follows and in the claims the terms "up," "down," "top," "bottom," "vertical," "horizontal," and like terms may be employed. These terms are intended to show relative orientation only and not any orientation with respect to gravity.

FIG. 1 schematically depicts a lithographic apparatus. The apparatus comprises an illumination system (illuminator) IL configured to condition a radiation beam B (e.g., UV radiation or DUV radiation), a support structure (e.g., a mask table) MT constructed to support a patterning device (e.g., a mask) MA and connected to a first positioner PM configured to accurately position the patterning device in accordance with certain parameters, a substrate table (e.g., a wafer table) WT constructed to hold a substrate (e.g., a resist-coated wafer) W and connected to a second positioner PW configured to accurately position the substrate in accordance with certain parameters, and a projection system (e.g., a refractive projection lens system) PL configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring again to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PL, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies. The wafer may also include additional marks such as, for example, marks that are sensitive to variations in a chemical mechanical planarization (CMP) process used as a step in wafer fabrication.

Figure 2:
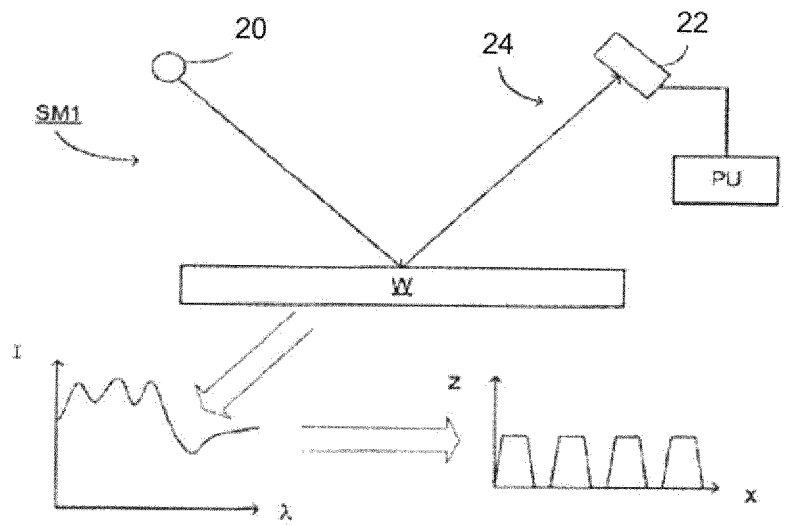
FIG. 2 is a schematic diagram of a scanning portion of the photolithography system of FIG. 1.

FIG. 2 depicts a scatterometer SM1 which may be used in the present invention. It comprises a broadband (white light) radiation projector 20 which projects radiation onto a substrate W. The reflected radiation is passed to a spectrometer detector 22, which measures a spectrum 24 (intensity as a function of wavelength) of the specular reflected radiation. From this data, the structure or profile giving rise to the detected spectrum may be reconstructed by processing unit PU, e.g., by Rigorous Coupled Wave Analysis and non-linear regression or by comparison with a library of simulated spectra as shown at the bottom of FIG. 2. In general, for the reconstruction the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Figure 3:
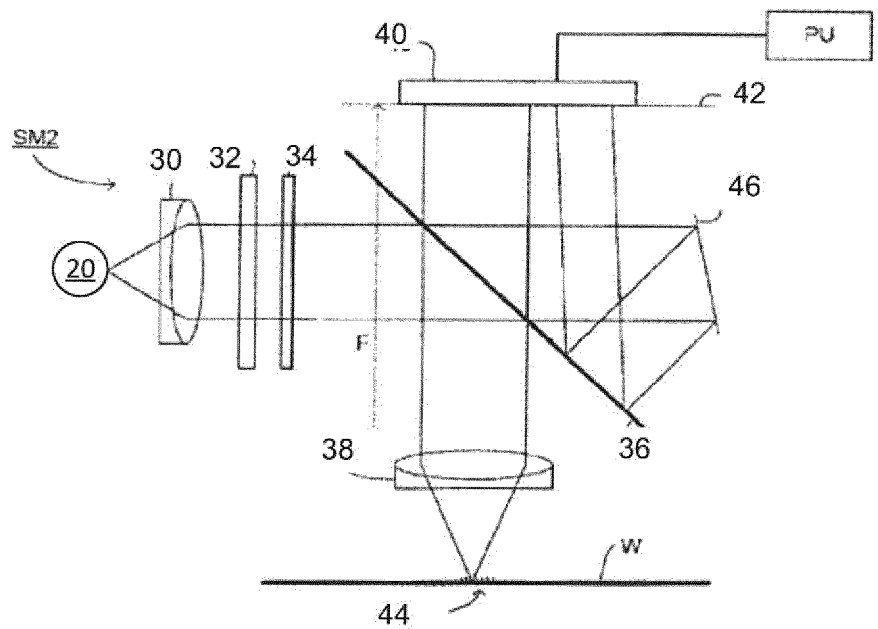
FIG. 3 is a schematic diagram of an alternative scanning portion of the photolithography system of FIG. 1.

Another scatterometer SM2 that may be used with the present invention is shown in FIG. 3. In this device, the radiation emitted by radiation source 2 is focused using lens system 30 through interference filter 32 and polarizer 34, reflected by partially reflected surface 36 and is focused onto substrate W via a microscope objective lens 38, which has a high numerical aperture (NA), preferably at least 0.9 and more preferably at least 0.95 Immersion scatterometers may even have lenses with numerical apertures over 1. The reflected radiation then transmits through partially reflective surface 36 into a detector 40 in order to have the scatter spectrum detected. The detector may be located in the back-projected pupil plane 42, which is at the focal length of the lens system 38, however the pupil plane may instead be re-imaged with auxiliary optics (not shown) onto the detector. The pupil plane is the plane in which the radial position of radiation defines the angle of incidence and the angular position defines azimuth angle of the radiation. The detector is preferably a two-dimensional detector so that a two-dimensional angular scatter spectrum of a substrate target 44 can be measured. The detector 40 may be, for example, an array of CCD or CMOS sensors, and may use an integration time of, for example, 40 milliseconds per frame.

A reference beam is often used for example to measure the intensity of the incident radiation. To do this, when the radiation beam is incident on the beam splitter 36 part of it is transmitted through the beam splitter as a reference beam towards a reference mirror 46. The reference beam is then projected onto a different part of the same detector 40.

A set of interference filters may be is available to select a wavelength of interest in the range of, say, 405-790 nm or even lower, such as 200-300 nm. The interference filter may be tunable rather than comprising a set of different filters. A grating could be used instead of interference filters.

The detector 40 may measure the intensity of scattered light at a single wavelength (or narrow wavelength range), the intensity separately at multiple wavelengths or integrated over a wavelength range. Furthermore, the detector may separately measure the intensity of transverse magnetic— and transverse electric-polarized light and/or the phase difference between the transverse magnetic—and transverse electric-polarized light.

Using a broadband light source (i.e., one with a wide range of light frequencies or wavelengths—and therefore of colors) is possible, which gives a large etendue, allowing the mixing of multiple wavelengths. The plurality of wavelengths in the broadband preferably each has a bandwidth of $\Delta\lambda$, and a spacing of at least $2\Delta\lambda$ (i.e., twice the bandwidth). Several "sources" of radiation can be different portions of an extended radiation source which have been split using fiber bundles. In this way, angle resolved scatter spectra can be measured at multiple wavelengths in parallel. A 3-D spectrum (wavelength and two different angles) can be measured, which contains more information than a 2-D spectrum. This allows more information to be measured which increases metrology process robustness. This is described in more detail in EP1,628,164A, which is incorporate by reference herein in its entirety.

The target 30 on substrate W may be, for example, (a) a resist layer grating, which is printed such that after development, the bars are formed of solid resist lines, or (b) a product layer grating, or (c) a composite grating stack in an overlay target structure comprising a resist grating overlaid or interleaved on a product layer grating. The bars may alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. Accordingly, the scatterometry data of the printed gratings is used to reconstruct the gratings.

The parameters of the grating, such as line widths and shapes, may be input to the reconstruction process, performed by processing unit PU, from knowledge of the printing step and/or other scatterometry processes.

In other words, a powerful light source beams light through a mark on a reticle. The light lands upon the gratings in the mark, e.g., TIS or PARIS plate. For example, the ASML PAS 5500 uses wafer alignment marks that are diffraction gratings. There are marks for both the x and y directions. These marks are illuminated with a HeNe laser at a single wavelength near 632.8 nm. The reflected wave exhibits a diffraction pattern of bright and dark lines that are focused on a sensor. The stage is moved slightly to learn the best position to match the sensor and that stage position is used to calculate the stage position to place the die under the center of the optical column.

The data can for example be obtained with any type of alignment sensor, for example a SMASH (SMart Alignment Sensor Hybrid) sensor, as described in U.S. Pat. No. 6,961,116, which is incorporated by reference herein in its entirety, that employs a self-referencing interferometer with a single detector and four different wavelengths, and extracts the alignment signal in software, or ATHENA (Advanced Technology using High order ENhancement of Alignment), as described in U.S. Pat. No. 6,297,876, which is incorporated by reference in its entirety, which directs each of seven diffraction orders to a dedicated detector.

The raw scan signal may be processed to extract information about the surface that was scanned. For example, an FFT curve fitting may be used to extract frequency data. This frequency data may be used for some purposes, but characterizing and breaking down additional structure and content in the alignment signal can supply additional data that can be used for additional purposes. In particular, local fitting may be used to obtain additional relevant data. Below is a specific example of a method of characterizing and breaking down additional structure and content in the alignment signal that involves the use of a Hilbert transform of the FFT signal. It should be noted, however, that alternatives are possible, for example, characterization and/or breakdown of the signal in Fourier space.

More specifically, local characterization and breakdown may, for instance, include the determining any one or combination of the local additive background (local DC offset or DC content), multiplicative breakdown (local instantaneous amplitude) and local phase variation. As regards local DC content and local amplitude, an FFT fit can be performed to extract the periodic signal from the raw alignment signal. Then the FFT result and DC content are fitted locally, i.e., around a sample. This is repeated for each sample taking, for example, one period (about 14 samples) around each. The fitted FFT result and DC content may then be subtracted from the raw alignment signal. The results of the subtraction, the residual signal, exhibit significant structure within the mark phase variation. To include local phase, the local DC content and local FFT fit are evaluated for one period around each sampled point. The localized FFT fit will contain the first, second, third and up to the Nth order signals. Then a Hilbert transform is performed on the FFT fit. As is understood, operation is substantially the same as a 90° phase shift in the FFT fit.

The Fourier transform is complex. Taking the transform of any real signal will result in a set of complex coefficients. Complex numbers are essentially 2D vectors, meaning they have two components, magnitude and phase angle. The magnitude conveys information about the distribution of signal energy through frequency. However, every signal also has a phase spectrum, and the phase encodes the distribution of the signal energy through time. The Hilbert transform is a linear operator that produces a 90° phase shift in a signal. It is useful in calculating instantaneous attributes of a time series, especially the amplitude and frequency. The instantaneous amplitude is the amplitude of the complex Hilbert transform; the instantaneous frequency is the time rate of change of the instantaneous phase angle. The instantaneous phase reflects the way in which the local phase angle varies linearly over a single cycle.

Figure 4:
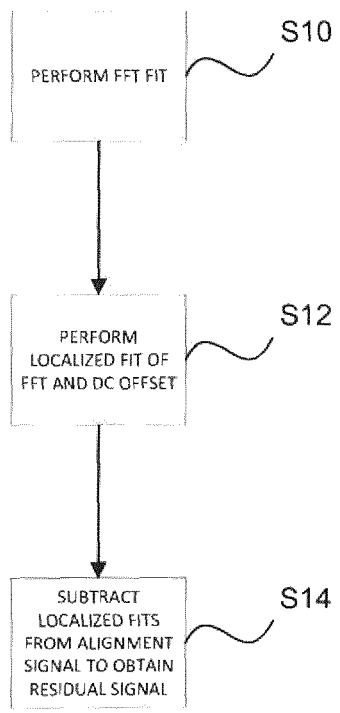
FIG. 4 is a flowchart of a method of aligning a wafer according to aspects of an embodiment disclosed herein.

According to an example, as shown in FIG. 4, first in a step S10 an FFT fit is performed to determine phase and intensity of all alignment orders and extract the periodic signal. Then in a step S12 a parameter of the alignment signal (e.g., amplitude, offset, phase or a combination thereof) is evaluated on the alignment signal locally on a per sample basis. In example shown in the figure, the parameters are localized FFT (amplitude) and localized DC offset. This may be done by linear regression taking X samples around the sample to be evaluated, where X is approximately one alignment period. Then in a step S14 the localized parameters are subtracted from the alignment signal to obtain a residual signal.

Figure 5A:
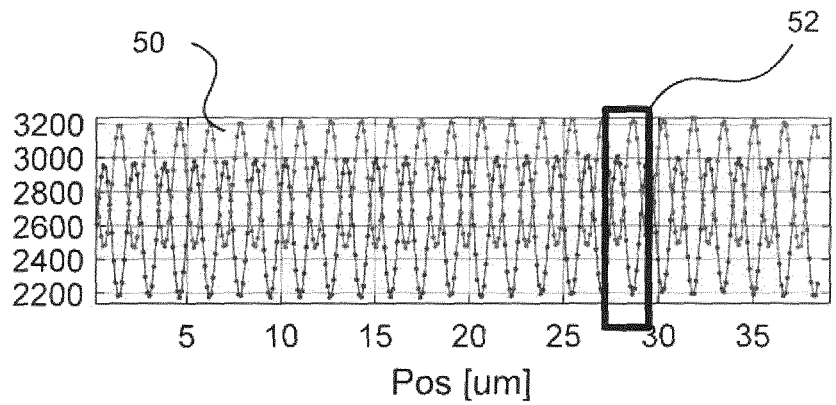
FIGS. 5A and 5B are graphs illustrating certain aspects of an embodiment disclosed herein.
Figure 5B:
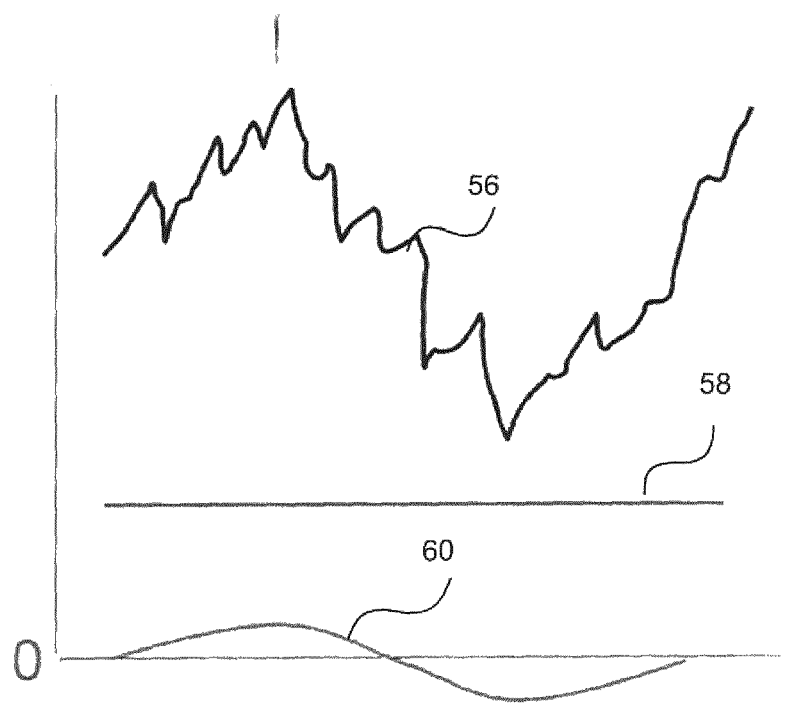
Figure 6A:
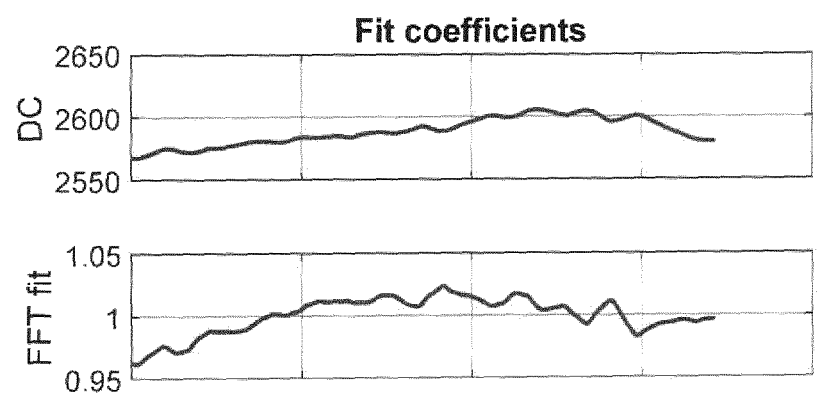
FIGS. 6A and 6B are graphs illustrating certain aspects of an embodiment disclosed herein.
Figure 6B:
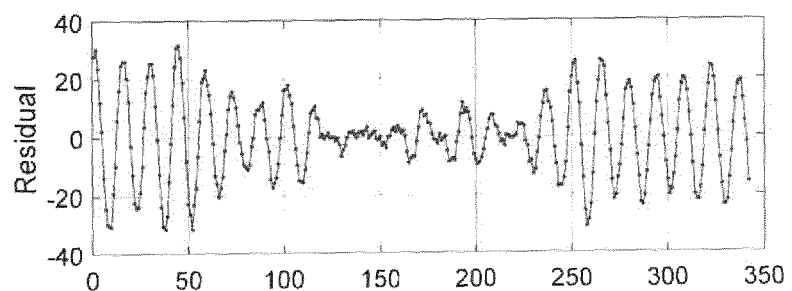

FIGS. 5A and 5B show the results of local fitting. FIG. 5A shows a raw alignment signal 50. A sample is evaluated from the raw signal over an interval 52 which is roughly one alignment period. Curve 56 in FIG. 5B shows the results of local FFT fitting over the interval. Curve 58 in FIG. 5B shows the results of local DC content over the interval. Curve 60 in FIG. 5B shows the results of smoothing out (removing high frequency components from) the local FFT fitting over the interval as will be explained below. FIGS. 6A and 6B show an example of calculated local fit coefficients for the DC offset (upper curve) and FFT fit coefficients (lower curve). FIG. 6B shows the residual signal resulting from subtracting these curves from the alignment signal.

Figure 7:
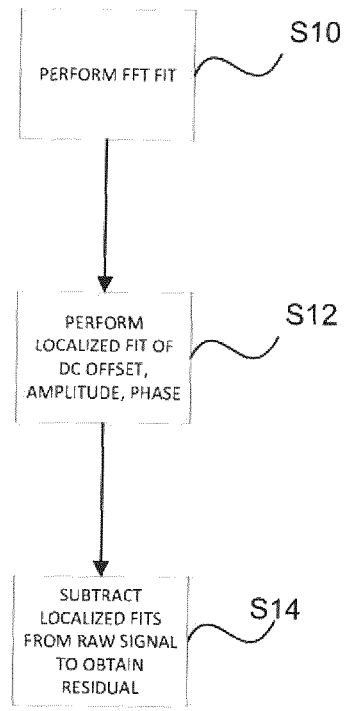
FIG. 7 is a flowchart of a method of aligning a wafer according to aspects of an embodiment disclosed herein.

Local phase can also be computed and used in conjunction with the localized fits. An example of this is shown in FIG. 7. As above, first in a step S10 an FFT fit is performed to determine phase and intensity of all alignment orders. Then in a step S12 three localized parameters of the alignment signal (offset, amplitude, and phase) are evaluated on the alignment signal locally on a per sample basis. In other words, all three parameters are fitted on each local part of the signal together, these being the DC offset and the signal amplitude and phase (by locally taking the FFT fit result and its Hilbert transform). The fit coefficients of the FFT fit part, and its Hilbert transform are then converted into a phase and amplitude part, as with a cos+sin fit, where the phase is close to a pure sine wave. The results may then be subtracted from the alignment signal to obtain a residual signal in step S14.

Figure 8A:
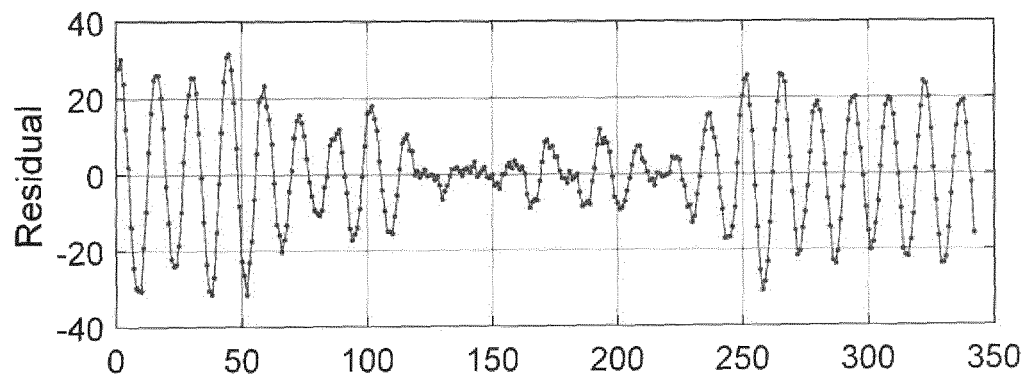
FIGS. 8A and 8B are graphs illustrating certain aspects of an embodiment disclosed herein.
Figure 8B:
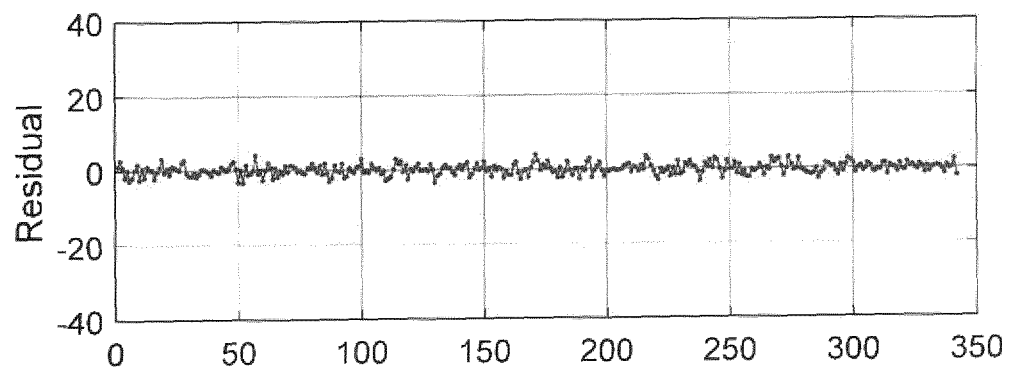

FIG. 8A shows a sample of a residual signal without fitting the phase content using the Hilbert transform part of the FFT fit signal and FIG. 8B shows a sample of a residual signal with the results of the phase fit subtracted.

It may be advantageous to smooth the fit coefficients over a number of samples, for example, the alignment period. Smoothing over an interval smaller than the alignment period can be performed without concern about losing salient information because high frequency content in the signal having a period less than the alignment period cannot be attributed to amplitude, offset, or phase. For example, the fit coefficients may be smoothed out over S samples where S is about 14. It should be noted that if the signal contains multiple frequencies (alignment orders), the Hilbert transform approximation of the phase will mix up the orders. Individual fitting of phase per order could be possible at the cost of a higher error propagation in the fit.

In few instances smoothing the FFT fit and Hilbert content can lead to DC content in the residual. This may be counteracted by smoothing the residual over 2×S samples and adding the smoothed residual to the DC content.

The determined local offset, amplitude, and/or phase can also be characterized further to determine key performance indicators. Such indicators may include signal/noise ratios, polynomial coefficients of fitting background content up to the nth order, and the effect on nanometer-level accuracy by simulating impact of background content and noise residual on perfect marks. Each indicator may also have a variant taking the difference between multiple colors/orders/polarizations.

The ability to obtain key performance indicators like this is useful to monitor scanner and product performance. For customer processes these indicators may be evaluated in the design phase to select the best alignment marks for use in a given process and also to monitor the product once in high volume manufacturing. Changes to the alignment signal background content could also be tracked for, e.g., the PARIS plates with a control loop to check if any change is still within control limits or if PARIS sensor needs to be swapped.

Thus, according to one aspect the signal structure in a fit residual is used to derive various performance indicators which can in turn be used in diagnosing and controlling both scanner and user processes. According to one example, a breakdown is determined by fitting the local offset, amplitude, and phase (or any combination thereof) for each sample in the measured signal, of which coefficients will be used for diagnostic purposes to control both scanner and user processes. Also, the alignment signal can be corrected by reducing crosstalk from background content into the aligned position.

The phase content of specific features in the additive and multiplicative background from a light source with sufficient coherence length (green) can be used to determine the Z-height between the sensor objective and the reflecting layer in the wafer stack, providing an independent height measurement on top of existing measurements from, for example, a level sensor and an air gauge. A green laser has been shown to have periodic background content on certain wafers. The Z-height can be used, for example, to control exposure focus, for example, in a feedback loop. Estimating Z-height this way requires a vertical scan move made together with the horizontal scan of the mark.

Also, a mark deformation effect can be measured across the mark scan length, by evaluating the breakdown content differences between colors and polarizations. This is likely to provide higher accuracy for certain disturbances as there is a large common background content.

High spatial frequency grid content may be measured by evaluating the local phase per sub segment of the signal from a single scan of the mark. This could be used to evaluate system grid content as well as high frequency intrafield product effects. A sufficiently powerful processor can perform the necessary calculations without incurring a throughput or timing penalty, in which case all diagnostics could be available for all alignment scans. This enables generation of large amount of diagnostics data for each wafer without any impact on the existing sequence.

A system as described above can be used not just to improve overlay alignment but also to diagnose, monitor, and/or adjust scanner performance in general. The system can monitor and report. The localized fit data derived from a scan can be compared to localized fit data for known conditions to ascertain what, if any, adjustments need to be made. As an example, it may be known a priori that local fit data having a large multiplicative (amplitude) component is indicative of a defective alignment mark. For wafers that have multiple sets of alignment marks, the local fit data can be used to determine which set of marks should be used. A target portion of the wafer may include marks or structures other than alignment marks. Deriving local fit data from such marks can be used to characterize other processes or as an indication of wafer quality. To use a specific example, the mark could be one that is particularly sensitive to deviations in a CMP processing step, and the local fit data derived from a scan of that mark could be used as an indication of whether the CMP portion of the manufacturing process is performing within acceptable parameters. The local fit data could be used to generate a feedback parameter in a feedback loop controlling CMP or some other aspect of wafer processing.

Also, local fit data from a single scan can be used for multiple purposes. For example, local fit data from a first part of a scan can be used to determine mark position and hence overlay, while local fit data derived from a later part of the scan can be used to obtain a measure of wafer quality.

Figure 9:
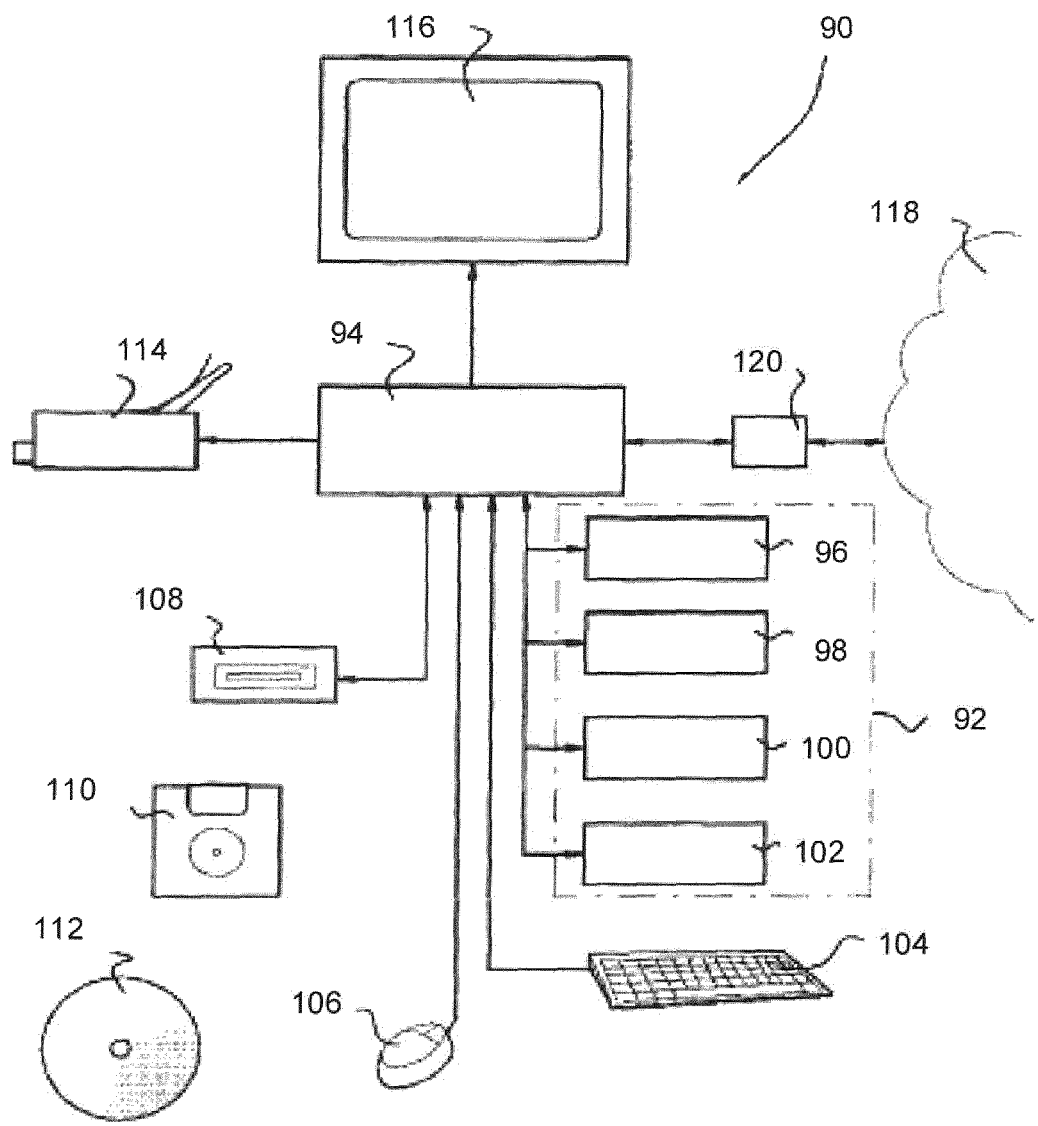
FIG. 9 is a schematic diagram of a processor system such as could be used to according to aspects of an embodiment disclosed herein.

The above processes may be implemented in one or more computer assembly 90 as shown in FIG. 9. The computer assembly 90 may be a dedicated processor or, alternatively, be a central computer controlling the lithographic apparatus. The computer assembly 90 may be arranged for loading a computer program product comprising computer executable code. This may enable the computer assembly 90, when the computer program product is downloaded, to control aforementioned uses of lithographic and inspection apparatuses.

The memory 92 connected to processor 94 may comprise a number of memory components such as a hard disk 96, Read Only Memory (ROM) 98, Electrically Erasable Programmable Read Only Memory (EEPROM) 100 or Random Access Memory (RAM) 102. Not all aforementioned memory components need to be present. Furthermore, it is not essential that aforementioned memory components are physically in close proximity to the processor 94 or to each other. They may be located at a distance away.

The processor 94 may also be connected to some kind of user interface, for instance a keyboard 104 or a mouse 106. A touch screen, track ball, speech converter or other interfaces that are known to persons skilled in the art may also be used.

The processor 94 may be connected to a reading unit 108, which is arranged to read data, e.g., in the form of computer executable code, from and under some circumstances store data on a data carrier, like a floppy disc 110 or a CDROM 112. Also DVDs, flash drives, or other data carriers known to persons skilled in the art may be used.

The processor 94 may also be connected to a printer 114 to print out output data on paper as well as to a display 116, for instance a monitor or LCD (Liquid Crystal Display), of any other type of display known to a person skilled in the art.

The processor 94 may be connected to a communications network 118, for instance a public switched telephone network (PSTN), a local area network (LAN), a wide area network (WAN) etc. by means of transmitters/receivers 120 responsible for input/output (I/O). The processor 94 may be arranged to communicate with other communication systems via the communications network 118. In an embodiment of the invention external computers (not shown), for instance personal computers of operators, can log into the processor 94 via the communications network 118.

The processor 94 may be implemented as an independent system or as a number of processing units that operate in parallel, wherein each processing unit is arranged to execute sub-tasks of a larger program. The processing units may also be divided in one or more main processing units with several subprocessing units. Some processing units of the processor 94 may even be located a distance away of the other processing units and communicate via communications network 118.

The embodiments may further be described using the following clauses:

1. Apparatus for controlling processing of a wafer in a lithographic apparatus, the apparatus comprising:
a light source for illuminating at least a portion of the wafer;
a sensor for sensing light from the portion when the portion is being illuminated by the light source and for generating a scan signal indicative of the sensed light; and
a processor arranged to receive the scan signal and adapted to generate a plurality of local fit coefficients respectively for each of a plurality of samples of the scan signal and to generate a control signal based at least in part on the plurality of local fit coefficients; and
a controller arranged to receive the control signal for controlling at least one aspect of processing the wafer based at least in part on the control signal.

2. Apparatus of clause 1 wherein the at least one aspect is overlay alignment and the portion comprises at least one alignment mark.

3. Apparatus of clause 1 wherein the at least one aspect is chemical mechanical polishing and the portion comprises at least one mark sensitive to variation in chemical mechanical polishing.

4. A system of clause 1 wherein the sensor has an objective and the processor is adapted to use at least a subset of the plurality of local fit coefficients to determine a distance between the objective and a reflecting layer on the wafer, and wherein the controller generates the control signal based at least in part on the distance to control exposure focus at least in part on the control signal.

5. Apparatus of clause 1 wherein the plurality of local fit coefficients comprises a plurality of local DC offset coefficients.

6. Apparatus of clause 1 wherein the plurality of local fit coefficients comprises a plurality of local amplitude coefficients.

7. Apparatus of clause 6 wherein the plurality of local amplitude coefficients are calculated using a fast Fourier transform.

8. A system of clause 1 wherein the plurality of local fit coefficients comprises a plurality of local phase coefficients.

9. Apparatus of clause 8 wherein the plurality of local phase coefficients are calculated using a Hilbert transform.

10. Apparatus of clause 1 wherein the plurality of local fit coefficients are smoothed.

11. A system for aligning a wafer in a lithographic apparatus, the wafer including at least one alignment mark, the system comprising:
   a light source for illuminating the mark;
   a sensor for sensing light from the mark when the mark is being illuminated by the light source and for generating an alignment scan signal indicative of the light from the mark; and
   a processor arranged to receive the signal and adapted to generate a respective at least one local fit coefficient for each of a plurality of samples of the signal,
   wherein the lithographic apparatus is adapted to use the at least one local fit coefficient to adjust alignment of the wafer.

12. A system of clause 11 wherein the mark is transmissive.

13. A system of clause 11 wherein the mark is reflective.

14. A system of clause 11 wherein the at least one fit coefficient is a local FFT fit coefficient.

15. A system of clause 11 wherein the at least one fit coefficient is smoothed.

16. A system of clause 11 wherein the at least one fit coefficient is a local DC offset fit coefficient.

17. A system of clause 11 wherein the at least one fit coefficient is a local Hilbert transform fit coefficient.

18. A system of clause 11 wherein the processor is adapted to generate a respective at least one local fit coefficient for each of a plurality of samples of the signal to generate a plurality of local fit coefficients and to subtract the plurality of fit coefficients from the alignment signal to generate a residual signal and wherein the lithographic apparatus is adapted to use the residual signal to adjust alignment of the wafer.

19. A system of clause 11 wherein the processor is adapted to use the at least one local fit coefficient to determine a deformation of the mark.

20. A system of clause 11 wherein the processor is adapted to use the at least one local fit coefficient to determine high spatial frequency grid content by evaluating a local phase per subsegment of the signal from a single scan of the mark.

21. A system for aligning a wafer in a lithographic apparatus, the wafer including at least one alignment mark, the system comprising:
   a light source for illuminating the mark;
   a sensor for sensing light from the mark when the mark is being illuminated by the light source and for generating an alignment scan signal indicative of the light from the mark; and
   a processor arranged to receive the signal and adapted to generate a respective local FFT fit coefficient for each of a plurality of samples of the signal to generate a corresponding plurality of local FFT fit coefficients for the plurality of samples and to generate a respective local DC fit coefficient for each of a plurality of samples of the signal to generate a corresponding plurality of local DC fit coefficients for the plurality of samples and for each sample subtract a respective one of the plurality of local FFT fit coefficients and a respective one of the plurality of DC fit coefficients from the alignment signal for the sample to obtain a residual signal for the plurality of samples,
   wherein the lithographic apparatus is adapted to use the residual signal to adjust alignment of the wafer.

22. A method of processing a wafer in a lithographic apparatus comprising the steps of:
   illuminating a portion of the wafer using a light source;
   sensing light from the portion when the portion is being illuminated by the light source;
   generating a scan signal indicative of the sensed light;
   generating a plurality of local fit coefficients respectively for each of a plurality of samples of the scan signal;
   generating a control signal based at least in part on the plurality of local fit coefficients; and
   controlling at least one aspect of processing the wafer based at least in part on the control signal.

23. A method of clause 22 wherein the at least one aspect is overlay alignment and the portion comprises at least one alignment mark.

24. A method of clause 22 wherein the at least one aspect is chemical mechanical polishing and the portion comprises at least one mark sensitive to variation in chemical mechanical polishing.

25. A method of clause 22 wherein the sensor has an objective and the processor is adapted to use at least a subset of the plurality of local fit coefficients to determine a distance between the objective and a reflecting layer on the wafer, and wherein the controller generates the control signal based at least in part on the distance to control exposure focus at least in part on the control signal.

26. A method of clause 22 wherein the plurality of local fit coefficients comprises a plurality of local DC offset coefficients.

27. A method of clause 22 wherein the plurality of local fit coefficients comprises a plurality of local amplitude coefficients.

28. A method of clause 27 wherein the plurality of local amplitude coefficients are calculated using a fast Fourier transform.

29. A method of clause 22 wherein the plurality of local fit coefficients comprises a plurality of local phase coefficients.

30. A method of clause 29 wherein the plurality of local phase coefficients are calculated using a Hilbert transform.

31. A method of aligning a wafer in a lithographic apparatus, the wafer including at least one alignment mark, the method comprising the steps of:
   illuminating the alignment mark using a light source;
   sensing light from the mark when the mark is being illuminated by the light source;
   generating an alignment scan signal indicative of the light from the mark;

generating a respective at least one local fit coefficient for each of a plurality of samples of the signal based on the signal; and using the at least one local fit coefficient to adjust alignment of the wafer.

32. A method of clause 31 wherein the mark is transmissive.

33. A method of clause 31 wherein the mark is reflective.

34. A method of clause 31 wherein the at least one fit coefficient is a local FFT fit coefficient.

35. A method of clause 31 wherein the at least one fit coefficient is a smoothed local FFT fit coefficient.

36. A method of clause 31 wherein the at least one fit coefficient is a local DC offset fit coefficient.

37. A method of clause 31 wherein the at least one fit coefficient is a local Hilbert transform fit coefficient.

38. A method of clause 31 wherein generating step further comprises generating a respective at least one local fit coefficient for each of a plurality of samples of the signal to generate a plurality of local fit coefficients and subtracting the plurality of fit coefficients from the alignment signal to generate a residual signal and wherein the using step comprises using the residual signal to adjust alignment of the wafer.

39. A method of clause 31 wherein the using step comprises using the at least one local fit coefficient to determine a deformation of the mark.

40. A method of clause 31 wherein the using step comprises using the at least one local fit coefficient to determine high spatial frequency grid content by evaluating a local phase per sub segment of the signal from a single scan of the mark.

41. A method of aligning a wafer in a lithographic apparatus, the wafer including at least one alignment mark, the method comprising the steps of:

illuminating the mark;

sensing light from the mark when the mark is being illuminated;

generating an alignment scan signal indicative of the light from the mark;

generating from the alignment scan signal a respective local FFT fit coefficient for each of a plurality of samples of the signal to generate a corresponding plurality of local FFT fit coefficients for the plurality of samples and to generate a respective local DC fit coefficient for each of a plurality of samples of the signal to generate a corresponding plurality of local DC fit coefficients for the plurality of samples;

for each sample, subtracting a respective one of the plurality of local FFT fit coefficients and a respective one of the plurality of DC fit coefficients from the alignment signal for the sample to obtain a residual signal for the plurality of samples; and using the residual signal to adjust alignment of the wafer.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The above description includes examples of multiple embodiments. It is, of course, not possible to describe every conceivable combination of components or methodologies for purposes of describing the aforementioned embodiments, but one of ordinary skill in the art may recognize that many further combinations and permutations of various embodiments are possible. Accordingly, the described embodiments are intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is construed when employed as a transitional word in a claim. Furthermore, although elements of the described aspects and/or embodiments may be described or claimed in the singular, the plural is contemplated unless limitation to the singular is explicitly stated. Additionally, all or a portion of any aspect and/or embodiment may be utilized with all or a portion of any other aspect and/or embodiment, unless stated otherwise.

The invention claimed is:

1. An apparatus for controlling processing of a wafer in a lithographic apparatus, the apparatus comprising:
   a light source configured to illuminate at least a portion of the wafer;
   a sensor configured to sense light after interacting with the portion of the wafer and generate a scan signal indicative of the sensed light;
   a processor configured to receive the scan signal and to generate a plurality of local fit coefficients respectively for each of a plurality of samples of the scan signal and to generate a control signal based at least in part on the plurality of local fit coefficients; and
   a controller configured to receive the control signal and control at least one aspect of processing the wafer based at least in part on the control signal.

2. The apparatus of claim 1, wherein the at least one aspect is overlay alignment and the portion comprises at least one alignment mark.

3. The apparatus of claim 1, wherein the at least one aspect is chemical mechanical polishing and the portion comprises at least one mark sensitive to variation in chemical mechanical polishing.

4. The system of claim 1, wherein the sensor has an objective and the processor is configured to use at least a subset of the plurality of local fit coefficients to determine a distance between the objective and a reflecting layer on the wafer, and wherein the controller generates the control signal based at least in part on the distance to control exposure focus at least in part on the control signal.

5. The apparatus of claim 1, wherein the plurality of local fit coefficients comprises a plurality of local DC offset coefficients.

6. The apparatus of claim 1, wherein the plurality of local fit coefficients comprises a plurality of local amplitude coefficients.

7. The apparatus of claim 6, wherein the plurality of local amplitude coefficients are calculated using a fast Fourier transform.

8. The system of claim 1, wherein the plurality of local fit coefficients comprises a plurality of local phase coefficients.

9. The apparatus of claim 8, wherein the plurality of local phase coefficients are calculated using a Hilbert transform.

10. The apparatus of claim 1, wherein the plurality of local fit coefficients are smoothed.

11. A system for aligning a wafer in a lithographic apparatus, the wafer including at least one alignment mark, the system comprising:
    a light source configured to illuminate the mark;
    a sensor configured to sense light after interacting with the mark and to generate an alignment scan signal indicative of the light from the mark; and
    a processor configured to receive the signal and to generate a respective at least one local fit coefficient for each of a plurality of samples of the signal,
    wherein the lithographic apparatus is configured to use the at least one local fit coefficient to adjust alignment of the wafer.

12. The system of claim 11, wherein the mark is transmissive.

13. The system of claim 11, wherein the mark is reflective.

14. The system of claim 11, wherein the at least one fit coefficient is a local fast Fourier transform fit coefficient.

15. The system of claim 11, wherein the at least one fit coefficient is smoothed.

16. The system of claim 11, wherein the at least one fit coefficient is a local DC offset fit coefficient.

17. The system of claim 11, wherein the at least one fit coefficient is a local Hilbert transform fit coefficient.

18. The system of claim 11, wherein the processor is further configured to generate a respective at least one local fit coefficient for each of a plurality of samples of the signal to generate a plurality of local fit coefficients, and to subtract the plurality of local fit coefficients from the alignment signal to generate a residual signal, and wherein the lithographic apparatus is adapted to use the residual signal to adjust alignment of the wafer.

19. The system of claim 11, wherein the processor is further configured to use the at least one local fit coefficient to determine a deformation of the mark.

20. The system of claim 11, wherein the processor is further configured to use the at least one local fit coefficient to determine high spatial frequency grid content by evaluating a local phase per subsegment of the signal from a single scan of the mark.

21. A system for aligning a wafer in a lithographic apparatus, the wafer including at least one alignment mark, the system comprising:
    a light source configured to illuminate the mark;
    a sensor configured to sense light after interacting with the mark and to generate an alignment scan signal indicative of the light from the mark; and
    a processor configured to receive the signal and to generate a respective local FFT fit coefficient for each of a plurality of samples of the signal to generate a corresponding plurality of local FFT fit coefficients for the plurality of samples, and to generate a respective local DC fit coefficient for each of a plurality of samples of the signal to generate a corresponding plurality of local DC fit coefficients for the plurality of samples, and for each sample subtract a respective one of the plurality of local FFT fit coefficients and a respective one of the plurality of local DC fit coefficients from the alignment signal for the sample to obtain a residual signal for the plurality of samples,
    wherein the lithographic apparatus is configured to use the residual signal to adjust alignment of the wafer.

* * * * *